United States Patent [19]

Pilo et al.

[11] Patent Number: 5,343,428
[45] Date of Patent: Aug. 30, 1994

[54] MEMORY HAVING A LATCHING BICMOS SENSE AMPLIFIER

[75] Inventors: Harold Pilo; John D. Porter, both of Austin, Tex.

[73] Assignee: Motorola Inc., Schaumburg, Ill.

[21] Appl. No.: 956,230

[22] Filed: Oct. 5, 1992

[51] Int. Cl.⁵ .................................... G11C 7/00
[52] U.S. Cl. ........................ 365/189.05; 365/225.6; 365/230.08; 307/530
[58] Field of Search .............. 365/189.05, 230.08, 365/208, 225.6; 307/530

[56] References Cited

U.S. PATENT DOCUMENTS

| | | | |
|---|---|---|---|
| 4,551,641 | 11/1985 | Pelley, III | 307/530 |
| 4,817,051 | 3/1989 | Chang | 365/225.6 X |
| 5,034,636 | 7/1991 | Reis et al. | 307/530 |
| 5,103,117 | 4/1992 | Voorman et al. | 307/279 |
| 5,103,121 | 4/1992 | Wendell et al. | 307/475 |
| 5,151,879 | 9/1992 | Hsueh et al. | 365/190 |
| 5,206,550 | 4/1993 | Mehta | 365/208 X |
| 5,239,506 | 8/1993 | Dachtera et al. | 365/189.05 |

Primary Examiner—Do Hyun Yoo
Attorney, Agent, or Firm—Daniel D. Hill

[57] ABSTRACT

A memory (80) having a latching BICMOS sense amplifier (20) includes a reduced power data retention mode. The latching BICMOS sense amplifier (20) senses and amplifies differential data signals corresponding to data from a selected memory cell (85). A latch (35) temporarily retains the logic state of the differential data signals in response to a clock signal. The reduced power data retention mode is provided by utilizing selectable current sources (66–75) responsive to an output enable signal. The latching BICMOS sense amplifier (20) allows for very high speed operation, yet provides for reduced power consumption while in a latched state.

17 Claims, 3 Drawing Sheets ns of various signals of the latching BICMOS sense amplifier

MEMORY HAVING A LATCHING BICMOS SENSE AMPLIFIER

FIELD OF THE INVENTION

This invention relates generally to memories, and more particularly, to a memory having a latching BICMOS sense amplifier.

BACKGROUND OF THE INVENTION

An integrated circuit memory, such as a static random access memory (SRAM), is generally implemented as an array of memory cells in a plurality of rows and columns. A synchronous SRAM memory receives a clock signal for controlling the timing of the memory, and the speed of a synchronous memory is fixed by the clock frequency. Synchronous memories are often used as data caches for microprocessors. A data cache increases the performance of the microprocessor by storing data the microprocessor is most likely to use, in a relatively small, very fast memory array. In data caches, very fast, high frequency operation is essential. Therefore, data caches today are being designed with synchronous SRAMs using BICMOS technology. A BICMOS circuit combines bipolar transistors with CMOS (complementary metal-oxide-semiconductor) transistors on the same integrated circuit. Generally, bipolar transistors provide the advantage of high speed and high drive capability, while CMOS transistors provide the advantage of reduced power consumption.

During a read cycle of a synchronous memory, a pair of complementary bit lines communicate a data bit as a differential voltage to a first sense amplifier. The first sense amplifier detects and amplifies the relatively small differential voltage and communicates it to the data output stages of the memory by way of read global data lines. The read global data lines provide the data to a multiplexer and a clock controlled latch, where it is directed to another sense amplifier, sometimes called a final sense amplifier. A level converter then converts the data provided by the final sense amplifier to CMOS logic levels, and a clock controlled CMOS latch temporarily holds the data for timing purposes. The data is then level converted again, if other than a CMOS level output signal is desired. Finally, an output buffer having high drive capability receives the data from the level converter and provides it as a single-ended data signal to a data output pad.

The clock controlled latch circuit of a synchronous memory is generally implemented utilizing CMOS transistors because of their relatively low power consumption. However, CMOS logic circuits are too slow for applications requiring high speed, such as today's high performance workstations. Also, the additional gate delay caused by performing logic level conversions to and from CMOS logic levels further reduces the cycle time, as well as requiring additional area on the integrated circuit. In contrast to CMOS logic circuits, BICMOS logic circuits provide high speed operation for applications such as workstations, but consume too much power for some applications, such as battery powered computers.

SUMMARY OF THE INVENTION

Accordingly, there is provided, in one form, a memory having a plurality of memory cells coupled to word lines and bit line pairs. Each memory cell receives data from the bit line pair to which it is coupled, when the word line to which it is coupled is enabled. A data output multiplexer receives a differential data signal corresponding to data from a selected bit line pair, and provides first and second data signals. A differential amplifier is included having first and second resistors, and first and second bipolar transistors. The first resistor is coupled between a first power supply voltage terminal and a collector of the first bipolar transistor. The second resistor is coupled between the first power supply voltage terminal and a collector of the second bipolar transistor. The differential amplifier receives the first and second data signals, and in response, provides third and fourth data signals. A latch feeds back the third and fourth data signals to a base of each of the second and first bipolar transistors, respectively, in response to a clock signal transitioning from a first logic state to a second logic state. Transfer gates prevent the differential amplifier from receiving the first and second data signals when the clock signal transitions from the first logic state to the second logic state. These and other features and advantages will be more clearly understood from the following detailed description taken in conjunction with the accompanying drawings.

DESCRIPTION OF A PREFERRED EMBODIMENT

Figure 1:
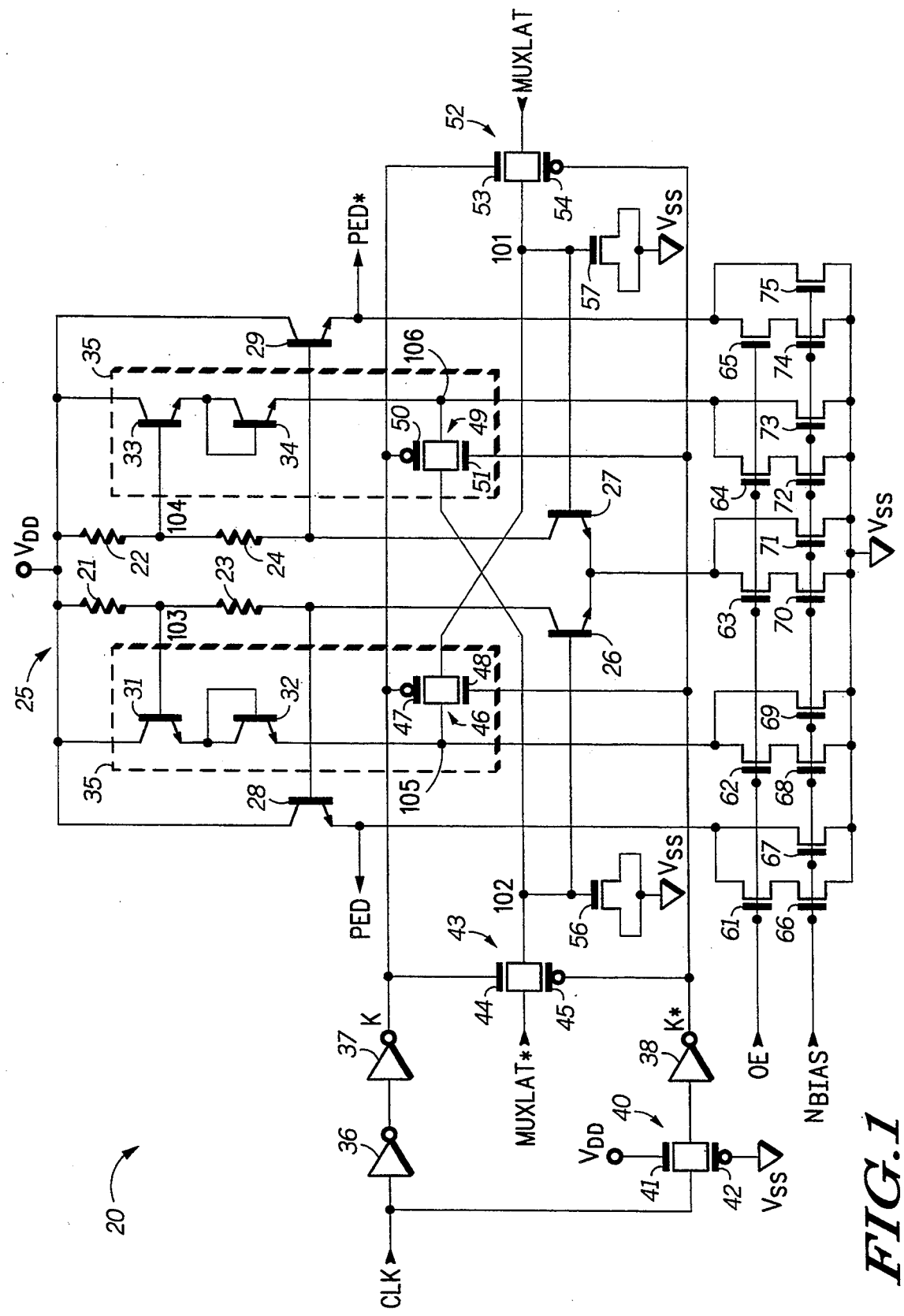
FIG. 1 illustrates in partial schematic diagram form and partial logic diagram form a latching BICMOS sense amplifier in accordance with the present invention.

FIG. 1 illustrates in partial schematic diagram form and partial logic diagram form latching BICMOS sense amplifier 20 in accordance with the present invention. Latching BICMOS sense amplifier 20 includes differential amplifier 25, latch 35, emitter-follower NPN bipolar transistors 28 and 29, inverters 36, 37, and 38, transfer gates 40, 43, and 52, capacitor connected N-channel transistors 56 and 57, and N-channel transistors 61–75. Differential amplifier 25 includes resistors 21, 22, 23, and 24, NPN bipolar transistors 26 and 27, and N-channel transistors 63, 70, and 71. Latch 35 includes NPN bipolar transistors 31, 32, 33, and 34 and transfer gates 46 and 49. Transfer gate 40 includes N-channel transistor 41 and P-channel transistor 42. Transfer gate 43 includes N-channel transistor 44 and P-channel transistor 45. Transfer gate 46 includes P-channel transistor 47 and N-channel transistor 48. Transfer gate 49 includes P-channel transistor 50 and N-channel transistor 51. Transfer gate 52 includes N-channel transistor 53 and P-channel transistor 54.

Resistor 21 has a first terminal connected to a positive power supply voltage terminal labeled "$V_{DD}$", and a second terminal connected to node 103. Resistor 22 has a first terminal connected to $V_{DD}$, and a second terminal connected to node 104. Resistor 23 has a first terminal connected to the second terminal of resistor 21 at node 103, and a second terminal. Resistor 24 has a first terminal connected to the second terminal of resistor 22, and a second terminal. NPN transistor 26 has a collector connected to the second terminal of resistor 23, a base connected to node 102, and an emitter. NPN transistor 27 has a collector connected to the second terminal of resistor 24, a base connected to node 101, and an emitter connected to the emitter of NPN transistor 26. N-channel transistor 63 has a drain connected to the emitters of NPN transistors 26 and 27, a gate for receiving an output enable signal labeled "OE", and a source. N-channel transistor 70 has a drain connected to the source of N-channel transistor 63, a gate for receiving a bias voltage labeled "$N_{BIAS}$", and a source connected to a negative power supply voltage terminal labeled "$V_{SS}$". N-channel transistor 71 has a drain connected to the drain of N-channel transistor 63, a gate for receiving bias voltage $N_{BIAS}$, and a source connected to $V_{SS}$. In a preferred embodiment, $V_{DD}$ receives an external power supply voltage equal to approximately 5.0 volts and $V_{SS}$ is connected to ground. Other power supply voltages can be used in other embodiments.

Emitter-follower transistor 28 has a collector connected to $V_{DD}$, a base connected to the second terminal of resistor 23, and an emitter for providing a data output signal labeled "PED". Emitter-follower transistor 29 has a collector connected to $V_{DD}$, a base connected to the second terminal of resistor 24, and an emitter for providing a data output signal labeled "PED*". Note that an asterisk (*) after a signal name indicates that the signal is active at a logic low. Emitter-follower transistor 31 has a collector connected to $V_{DD}$, a base connected to the second terminal of resistor 21 at node 103, and an emitter. Emitter-follower transistor 33 has a collector connected to $V_{DD}$, a base connected to the second terminal of resistor 22 at node 104, and an emitter. Diode-connected NPN transistor 32 has a base and a collector connected to the emitter of emitter-follower transistor 31, and an emitter connected to node 105. Diode-connected NPN transistor 34 has a base and a collector connected to the emitter of emitter-follower transistor 33, and an emitter connected to node 106.

Inverter 36 has an input terminal for receiving an external clock signal labeled "CLK", and an output terminal. Inverter 37 has an input terminal connected to the output terminal of inverter 36, and an output terminal for providing an internal clock signal labeled "K". N-channel transistor 41 of transfer gate 40 has a first current electrode connected to the input terminal of inverter 36, a gate connected to $V_{DD}$, and a second current electrode. P-channel transistor 42 has a first current electrode connected to the first current electrode of N-channel transistor 41, a gate connected to $V_{SS}$, and a second current electrode connected to the second current electrode of N-channel transistor 41. Inverter 38 has an input terminal connected to the second current electrodes of transistors 41 and 42, and an output terminal for providing an internal clock signal labeled "K*". N-channel transistor 44 of transfer gate 43 has a first current electrode for receiving a data input signal labeled "MUXLAT*", a gate connected to the output terminal of inverter 37, and a second current electrode connected to the base of NPN transistor 26 at node 102. P-channel transistor 45 has a first current electrode connected to the first current electrode of N-channel transistor 44, a gate connected to the output terminal of inverter 38, and a second current electrode connected to the second current electrode of N-channel transistor 44. P-channel transistor 47 of transfer gate 46 has a first current electrode connected to the emitter of diode-connected NPN transistor 32 at node 105, a gate connected to the output terminal of inverter 37, and a second current electrode connected to the base of NPN transistor 27 at node 101. N-channel transistor 48 has a first current electrode connected to the first current electrode of P-channel transistor 47 at node 105, a gate connected to the output terminal of inverter 38, and a second current electrode connected to the second current electrode of P-channel transistor 47 at node 101. P-channel transistor 50 has a first current electrode connected to the second current electrode of N-channel transistor 44 at node 102, a gate connected to the output terminal of inverter 37, and a second current electrode connected to the emitter of diode-connected NPN transistor 34 at node 106. N-channel transistor 51 has a first current electrode connected to the first current electrode of P-channel transistor 50, a gate connected to the output terminal of inverter 38, and a second current electrode connected to the second current electrode of P-channel transistor 50 at node 106. N-channel transistor 53 has a first current electrode connected to the base of NPN transistor 27 at node 101, a gate connected to the output terminal of inverter 37, and a second current electrode for receiving a data input signal labeled "MUXLAT". P-channel transistor 54 has a first current electrode connected to the first current electrode of N-channel transistor 53, a gate connected to the output terminal of inverter 38, and a second current electrode connected to the second current electrode of N-channel transistor 53.

N-channel transistor 61 has a drain connected to the emitter of emitter-follower transistor 28, a gate for receiving output enable signal OE, and a source. N-channel transistor 62 has a drain connected to the emitter of diode-connected NPN transistor 32, a gate for receiving output enable signal OE, and a source. N-channel transistor 64 has a drain connected to the emitter of diode-connected NPN transistor 34, a gate for receiving output enable signal OE, and a source. N-channel transistor 65 has a drain connected to the emitter of emitter-follower transistor 29, a gate for receiving output enable signal OE, and a source. N-channel transistor 66 has a drain connected to the source of N-channel transistor 61, a gate for receiving bias voltage $N_{BIAS}$, and a source connected to $V_{SS}$. N-channel transistor 67 has a drain connected to the emitter of emitter-follower transistor 28, a gate for receiving bias voltage $N_{BIAS}$, and a source connected to $V_{SS}$. N-channel transistor 68 has a drain connected to the source of N-channel transistor 62, a gate for receiving bias voltage $N_{BIAS}$, and a source connected to $V_{SS}$. N-channel transistor 69 has a drain connected to the emitter of diode connected NPN transistor 32, a gate for receiving bias voltage $N_{BIAS}$, and a source connected to $V_{SS}$. N-channel transistor 72 has a drain connected to the source of N-channel transistor 64, a gate for receiving bias voltage $N_{BIAS}$, and a source connected to $V_{SS}$. N-channel transistor 73 has a drain connected to the emitter of diode connected NPN transistor 34, a gate for receiving bias voltage $N_{BIAS}$, and a source connected to $V_{SS}$. N-channel transistor 74 has a drain connected to the source of N-channel transistor 65, a gate for receiving bias voltage $N_{BIAS}$, and a source connected to $V_{SS}$. N-channel transistor 75 has a drain connected to the emitter of emitter-follower transistor 29, a gate for receiving bias voltage $N_{BIAS}$, and a source connected to $V_{SS}$.

Capacitor-connected transistor 56 has first and second current electrodes connected to $V_{SS}$, and a gate connected to the second current electrode of N-channel transistor 44 at node 102. Capacitor-connected transistor 57 has first and second current electrodes connected to $V_{SS}$, and a gate connected to the first current electrode of N-channel transistor 53 at node 101.

In operation, external clock signal CLK is converted to complementary internal clock signals K and K* by CMOS inverters 36, 37, and 38. Transfer gate 40 provides a relatively small interval of gate delay, thus ensuring that as internal clock signals K and K* transition from one logic level to another, they cross each other at substantially the midpoint of each of their logic swings. When external clock signal CLK is a logic high, transfer gates 43 and 52 are conductive and transfer gates 46 and 49 are substantially non-conductive, allowing data input signals MUXLAT and MUXLAT* to be provided to differential amplifier 25. When external clock signal CLK transitions from a logic high to a logic low, transfer gates 43 and 52 become substantially nonconductive, thus preventing a new data input signal from entering latching BICMOS sense amplifier 20. Transfer gates 46 and 49 of latch 35 become conductive, thus allowing the logic states of data input signals MUXLAT and MUXLAT* to be temporally retained until the next clock cycle. The logic states of data input signals MUXLAT and MUXLAT* are "latched" within latching BICMOS sense amplifier 20 until external clock signal CLK returns to a logic high.

If external clock signal CLK is a logic high, then internal clock signal K is a logic high and internal clock signal K* is a logic low. Transfer gates 43 and 52 are conductive, allowing data input signals MUXLAT and MUXLAT* to be provided to the bases of NPN transistors 26 and 27, respectively. If data input signal MUXLAT is a logic high, and data input signal MUXLAT* is a logic low, then NPN transistor 27 is conductive and NPN transistor 26 is substantially non-conductive. A current designated as $I_{70}$, provided by a current source comprising N-channel transistors 70, and/or 71, is steered through NPN transistor 27. The voltage at the base of emitter-follower transistor 29 is equal to approximately $V_{DD}-I_{70}(R_{22}+R_{24})$, where $R_{22}$ is the resistance of resistor 22 and $R_{24}$ is the resistance of resistor 24. Data output signal PED* is therefore a logic low voltage equal to approximately $V_{DD}-I_{70}(R_{22}+R_{24})-V_{BE}$, where $V_{BE}$ is a base-emitter diode voltage drop, or approximately 0.8 volts. Data output signal PED is equal to a logic high voltage of approximately $V_{DD}-V_{BE}$.

Assuming that external clock signal CLK is still a logic high, if data input signal MUXLAT becomes a logic low and data input signal MUXLAT* becomes a logic high, the operation of latching BICMOS sense amplifier 20 is essentially reversed. Current $I_{70}$ is steered through NPN transistor 26. The voltage at the base of emitter-follower transistor 28 is approximately equal to $V_{DD}-I_{70}(R_{21}+R_{23})$, where $R_{21}$ is the resistance of resistor 21 and $R_{23}$ is the resistance of resistor 23. Data output signal PED is therefore a logic low voltage equal to approximately $V_{DD}-I_{70}(R_{21}+R_{23})-V_{BE}$ and data output signal PED* is equal to a logic high voltage of approximately $V_{DD}-V_{BE}$.

When external clock signal CLK becomes a logic low, the logic state of data input signals MUXLAT and MUXLAT* are latched by latch 35 until external clock signal CLK returns to a logic high. In operation, with a logic low external clock signal CLK, transfer gates 46 and 49 become conductive and transfer gates 43 and 52 become substantially non-conductive, allowing the voltage at nodes 105 and 106 to be fed back to the bases of NPN transistors 27 and 26, respectively. If data input signal MUXLAT is a logic high and data input signal MUXLAT* is a logic low, and external clock signal CLK transitions to a logic low, the feedback voltage at node 105 is a logic high and is approximately equal to $V_{DD}-2V_{BE}$, and the feedback voltage at node 106 is a logic low and is approximately equal to $V_{DD}-I_{70}R_{22}-2V_{BE}$. This feedback voltage through transfer gates 46 and 49 is provided to NPN transistors 26 and 27 and is at substantially the same voltage level as data input signals MUXLAT and MUXLAT*.

In the preferred embodiment, resistance $R_{21}$ is approximately equal to resistance $R_{22}$, and resistance $R_{23}$ is approximately equal to resistance $R_{24}$. The voltage drop across series-connected resistors 21 and 23 is equal to the voltage drop across series-connected resistors 22 and 24 and is approximately equal to 1.5 volts. About 20% of this voltage drop is across resistors 21 and 22 and the other 80% is across resistors 23 and 24. Resistors 21 and 22 function to decrease the feedback voltage of latch 35 to the bases of NPN transistors 27 and 26, respectively, so that during the next clock cycle, new data from data input signals MUXLAT and MUXLAT* may relatively easily "flip" the data on latch 35 if necessary. For a 5.0 volt power supply voltage, data input signals MUXLAT and MUXLAT* are complementary logic signals having logic swings from about 3.1 volts for a logic low to about 3.4 volts for a logic high. Note that latching BICMOS sense amplifier 20 can be adapted for use with an asynchronous memory by simply replacing external clock signal CLK with a control signal that is not clocked.

Transfer gates 46 and 49 have poor transconductance below one-half $V_{DD}$, therefore in the preferred embodiment, the voltage at nodes 105 and 106 are kept high enough allowing internal clock signals K and K* to provide adequate gate control for N-channel transistors 48 and 51, and P-channel transistors 47 and 50. Also, the current provided by N-channel transistors 70 and 71 should not be so large that the bipolar transistors operate in saturation. If the bipolar transistors operate in saturation, a reduction in switching speed may result. In addition, the gate-to-source capacitance of N-channel transistors 44 and 53 may cause the voltage at nodes 102 and 101, respectively, to follow the voltage of internal clock signal K. Capacitor-connected N-channel transistors 56 and 57 are sized relatively small to reduce this capacitive coupling, which may interfere with the operation of latching BICMOS sense amplifier 20. Capacitor-connected N-channel transistors 56 and 57 are illustrated in FIG. 1 as N-channel transistors having their drains and sources connected to $V_{SS}$, however, other types of capacitors may also be used.

Latching BICMOS sense amplifier 20 has a reduced power data retention mode that allows data to remain latched by latch 35 while reducing power consumption. The reduced power data retention mode is entered by providing output enable signal OE as a logic low, thus causing N-channel transistors 61–65 to become substantially non-conductive. N-channel transistors 61–65 function to select and deselect N-channel transistors 66, 68, 70, 72, and 74. This prevents N-channel transistors 66, 68, 70, 72, and 74 from providing current sources for the emitters of the bipolar transistors of latching BICMOS sense amplifier 20. N-channel transistors 67, 69, 71, 73, and 75 are sized to provide relatively weak current sources as compared to N-channel transistors 66, 68, 70, 72, and 74. During the low power data retention mode the differential voltage of nodes 105 and 106 is reduced from approximately 0.3 volts to approximately 0.15 volts, which may result in a substantial reduction in current consumption.

In CMOS logic circuits most of the current consumption is AC (alternating current). Therefore, as the operating speed of the CMOS circuit increases, its current consumption increases. However, in DC (direct current) circuits, the DC component of the total current consumption remains constant regardless of frequency. About 80% of the total current consumption of latching BICMOS sense amplifier 20 is DC, resulting in latching BICMOS sense amplifier 20 becoming more efficient as the operating frequency increases.

Latching BICMOS sense amplifier 20 provides the advantages of increased speed and performance for applications such as high performance workstations where the clock frequency may approach 100 megahertz. Since a separate CMOS latch is not used, the need for additional level converters is eliminated, reducing the number of stages in the output path, resulting in reduced gate delay. Also, the amount of surface area needed on the integrated circuit for the output circuits is reduced. In addition, the low power data retention mode allows high speed operation for applications such as workstations, yet provides for lower power consumption in applications such as battery powered computers.

Figure 2:
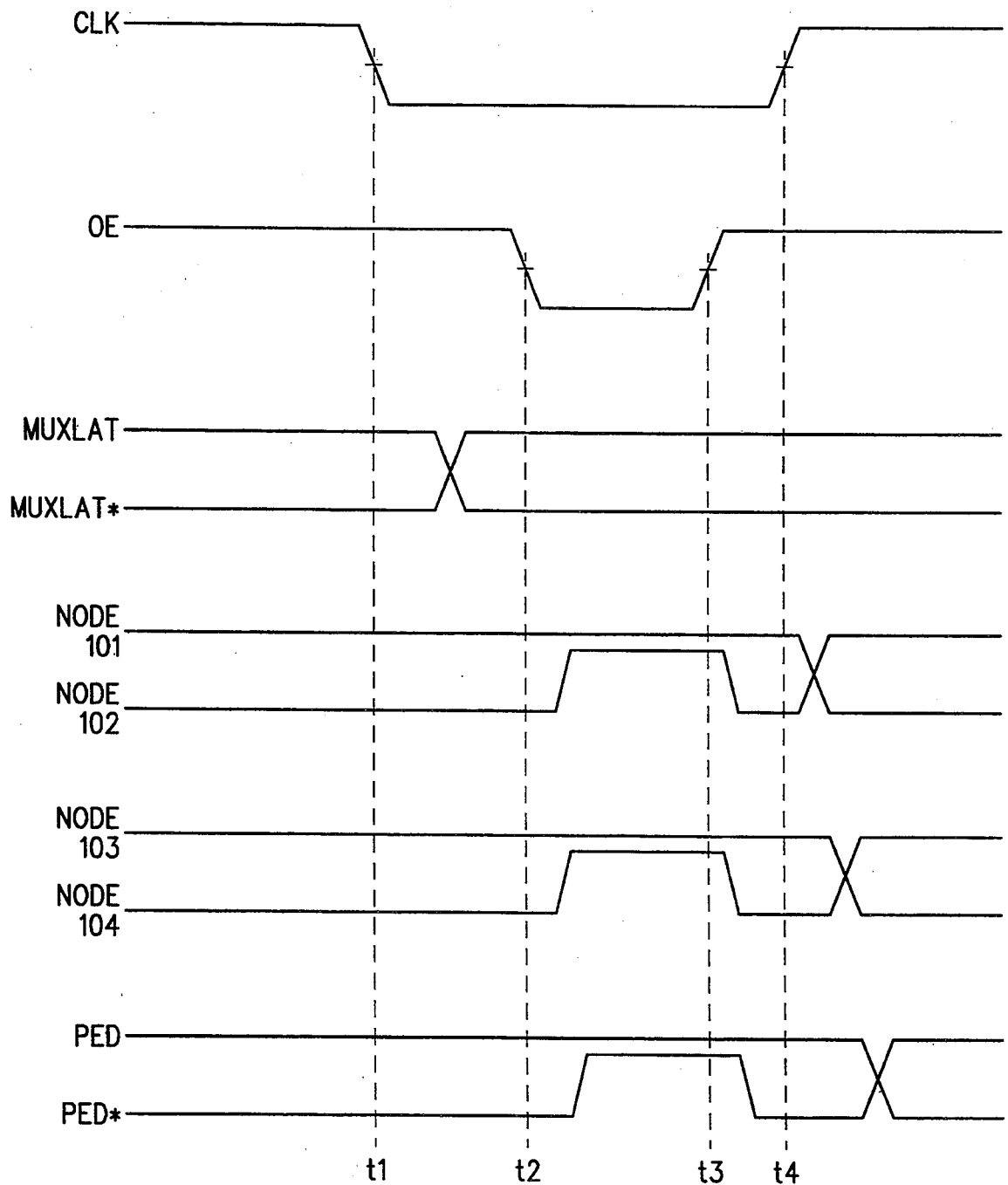
FIG. 2 shows a timing diagram of various signals of the latching BICMOS sense amplifier of FIG. 1 in accordance with the present invention.

FIG. 2 shows a timing diagram of various signals of latching BICMOS sense amplifier 20 of FIG. 1 in accordance with the present invention. (Note that the timing diagram of FIG. 2 is not drawn to scale.) At time t1, external clock signal CLK transitions from a logic high to a logic low, resulting in the logic states of differential data input signals MUXLAT and MUXLAT* becoming latched. Data input signals MUXLAT and MUXLAT* may then change logic states, as shown between time t1 and time t2, without affecting the latched logic states at nodes 101 and 102, nodes 103 and 104, or data output signals PED and PED*. At time t2, output enable signal OE transitions from a logic high to a logic low, beginning the low power data retention mode. The differential voltages on nodes 101 and 102, nodes 103 and 104, and data output signals PED and PED* are reduced, thus providing for low power consumption. At time t3, output enable signal OE is returned to a logic high. The differential voltages on nodes 101 and 102, nodes 103 and 104, and data output signals PED and PED* are returned to their normal voltage levels. At time t4, external clock signal CLK transitions from a logic low to a logic high, transfer gates 43 and 52 (illustrated in FIG. 1) become conductive, and the new data from data input signals MUXLAT and MUXLAT* is allowed to propagate through latching BICMOS sense amplifier 20. The logic states of nodes 101 and 102, nodes 103 and 104, and output data signals PED and PED* change states as shown after time t4 to reflect the logic state of data input signals MUXLAT and MUXLAT*.

Figure 3:
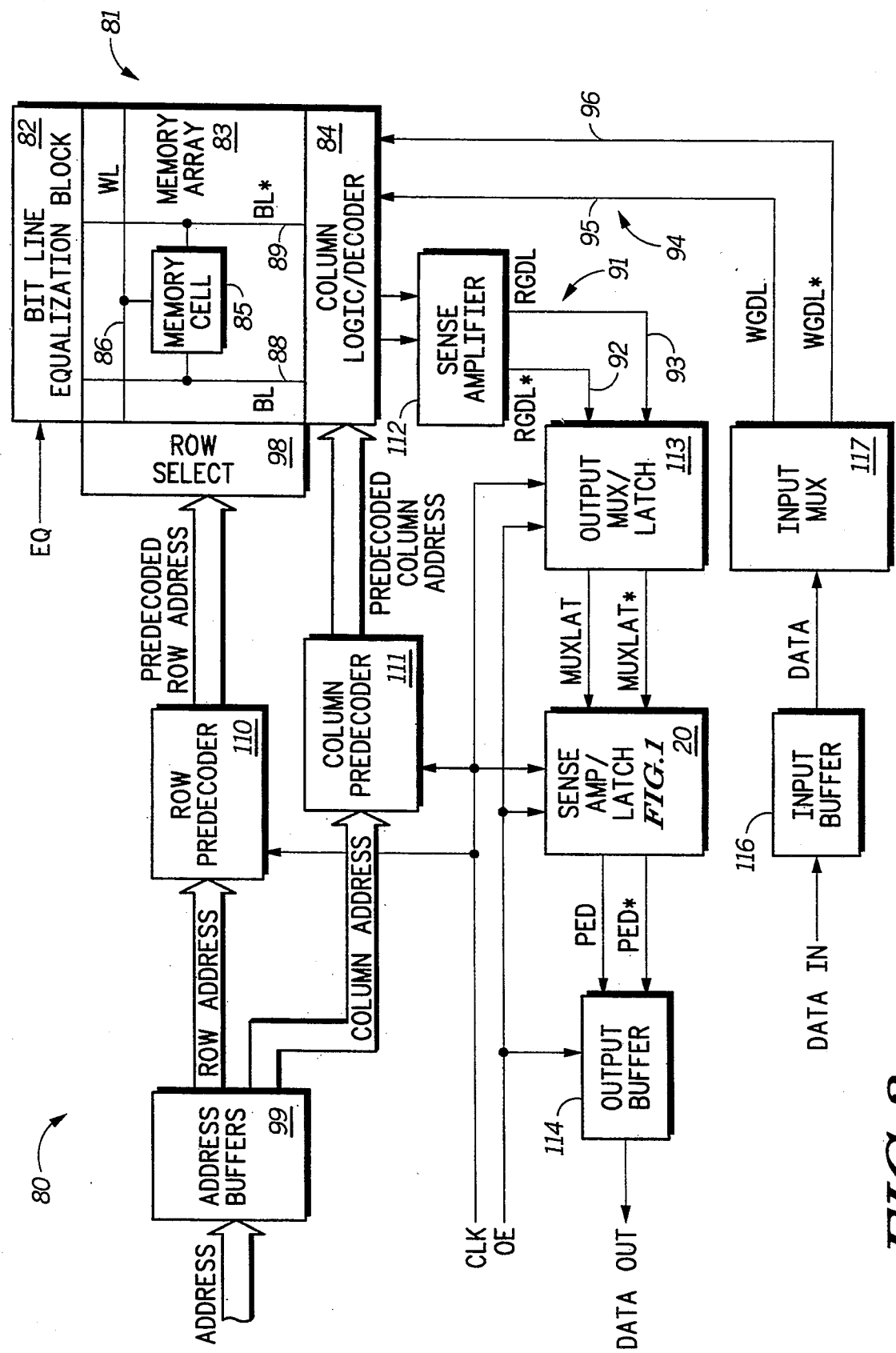
FIG. 3 illustrates in block diagram form a memory incorporating the latching BICMOS sense amplifier of FIG. 1 in accordance with the present invention.

FIG. 3 illustrates in block diagram form memory 80 in accordance with the present invention. Memory 80 includes memory block 81, row select circuitry 98, address buffer 99, row predecoder 110, column predecoder 111, read global data line pairs 91 and write global data line pairs 94, sense amplifier 112, data output multiplexer/latch 113, latching BICMOS sense amplifier 20, data output buffer 114, data input buffer 116, and data input multiplexer 117. Memory block 81 includes bit line equalization block 82, memory array 83, column logic/decoder 84, memory cell 85, word line 86, and bit lines 88 and 89. Memory block 81 is a representative memory block of memory 80 and there may be other memory blocks present in memory 80. Memory cells are located at intersections of word lines and bit line pairs. A representative memory cell 85 is illustrated in FIG. 3 connected to word line 86 and bit lines 88 and 89. Bit lines 88 and 89 comprise a bit line pair. Read global data line pair 91 includes a read global data line 92 and a read global data line 93. Write global data line pair 94 includes a write global data line 95 and a write global data line 96.

Address buffer 99 receives an address signal labeled "ADDRESS", and provides a buffered differential row address labeled "ROW ADDRESS", and a buffered differential column address labeled "COLUMN ADDRESS". In applications where the memory array is further sub-divided into blocks, a block address may also be provided by address buffers 99 to block logic (not shown). For simplicity, only one memory block 81 is shown. In other embodiments, different numbers of blocks, different sizes of blocks and different word widths could be used. A bit line equalization signal labeled "EQ" is provided to bit line equalization block 82. Bit line equalization block 82 may provide precharge and equalization to the each bit line pair of memory array 81, thus decreasing the cycle time of memory 80.

Row predecoder 110 receives external clock signal CLK, and differential row address signals ROW ADDRESS, and in response, provides a plurality of predecoded row address signals labeled "PREDECODED ROW ADDRESS" to row select 98. Column predecoder 111 receives external clock signal CLK, and differential column address signals COLUMN ADDRESS, and in response provides a plurality of predecoded column address signals labeled "PREDECODED COLUMN ADDRESS" to column logic/decoder 84. The particular address signals received by row predecoder 110 and column predecoder 111 have no special significance and may be different in other embodiments. Also, the amount of decoding performed by the row and column predecoders may be different in other embodiments.

In a preferred embodiment, memory 80 is synchronous and has a data organization of 64K×18, where memory block 81 is one of 32 memory blocks. Memory cells in memory array 83 are located at intersections of 512 word lines and 72 bit line pairs. Only one memory block is shown for the purposes of clarity and simplicity. Row select 98 receives a predecoded row address and in response, selects one of the 512 word lines. Also, note that only one pair of read global data lines, one pair of write global data lines, one sense amplifier, and one latching BICMOS sense amplifier 20 are shown. For a word width of ×18, memory 80 receives 16 address signals, and requires 18 read global data lines and 18 write global data lines. However, memory 80 could also be configured with other data organizations, such as 256K×4. For a different data organization, a different number of address signals, read and write global data lines, and other data input and output circuitry are required. In other embodiments, memory 80 may be an asynchronous ATD (address transition detection) type memory.

To read data from memory 80, row predecoder 110 receives a row address decoded from buffered differential row address signals ROW ADDRESS, and provides predecoded row address PREDECODED ROW ADDRESS to row select 98, to select one of the 512 word lines, of which word line 86 is an example. There are 72 memory cells coupled to each word line. Each memory cell that is coupled to the selected word line provides its output as a differential voltage on a corresponding bit line pair. Predecoded column address signals PREDECODED COLUMN ADDRESS are provided to column logic/decoder 84. For a word width of ×18, column logic/decoder 84 selects 9 bit line pairs of the 72 bit line pairs of memory block 81. Another memory block of memory 80 is selected simultaneously with memory block 81 to account for the other 9 bit line pairs needed to make up a word width of ×18. A first sense amplifier, such as sense amplifier 112, senses and amplifies the relatively small differential voltage provided to bit lines 88 and 89 by memory cell 85, and couples the selected bit line to read global data line pair 91. Read global data line pair 91 is representative of the 18 read global data line pairs in memory 80. Data output multiplexer/latch 113 receives differential data signals RGDL and RGDL* from read global data line pair 91 corresponding to the differential signals from bit lines 88 and 89. In response, data output multiplexer/latch 113 provides differential data signals MUXLAT and MUXLAT*. Output enable signal OE and external clock signal CLK synchronize and control the output of data from memory 80. Latching BICMOS sense amplifier 20 (circuit illustrated in FIG. 1) includes a final sense amplifier and receives data signals MUXLAT and MUXLAT* when external clock signal CLK is a logic high, as discussed above in reference to FIG. 1, and in response, provides differential data output signals PED and PED*. Latch 35 (FIG. 1) is included with latching BICMOS sense amplifier 20 to control the output data flow in response to receiving external clock signal CLK. Gate delay is reduced in comparison to conventional CMOS output stages, by combining the BICMOS clock controlled latch with a BICMOS final sense amplifier, thus decreasing the number of stages in the output path. Output buffer 114 receives data output signals PED and PED* and provides single-ended data signal DATA OUT to a data output pad (not shown).

During a write cycle of memory 80, the flow of data is essentially reversed. A single-ended data signal labeled "DATA IN" is provided to data input buffer 116, which in turn provides a buffered single-ended data signal labeled "DATA" to data input multiplexer 117. Data input multiplexer 117 provides differential data signals WGDL and WGDL* to write global data line pair 94. Write global data line pair 94 is representative of the 18 write global data line pairs in memory 80. Column predecoder 111 provides predecoded column address PREDECODED COLUMN ADDRESS to column logic/decoder 84 which couples a write global data line pair to a bit line pair. Row predecoder 110 provides predecoded row address PREDECODED ROW ADDRESS to row select 98 which selects one of 512 word lines. As in the read cycle, memory cells located on an enabled word line provide data to bit line pairs. However, a voltage differential driven onto the bit line pairs by column logic/decoder 84 is greater than the drive voltage of the memory cell and overwrites a stored bit in the memory cell. At the end of a write cycle the differential voltage on the bit line pair must be reduced to a level small enough to prevent the data from being erroneously written into a memory cell during the following read cycle. Equalization of the bit line pairs is achieved by bit line equalization block 82.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A memory having a plurality of memory cells coupled to word lines and bit line pairs, each memory cell providing data to the bit line pair to which it is coupled, when the word line to which it is coupled is enabled, comprising:

a differential amplifier, having first and second resistors, and first and second bipolar transistors, the first resistor being coupled between a first power supply voltage terminal and a collector of the first bipolar transistor, the second resistor being coupled between the first power supply voltage terminal and a collector of the second bipolar transistor, the differential amplifier for receiving first and second data signals corresponding to data from a selected bit line pair, and in response, providing third and fourth data signals;

latch means for feeding back the third and fourth data signals to a base of each of the second and first bipolar transistors, respectively, in response to a clock signal transitioning from a first logic state to a second logic state; and transfer gate means for preventing the differential amplifier from receiving the first and second data signals in response to the clock signal transitioning from the first logic state to the second logic state.

2. The memory of claim 1, wherein the latch means comprises:

a third bipolar transistor having a collector coupled to the first power supply voltage terminal, a base for receiving the third data signal, and an emitter;

a first diode having a first terminal coupled to the emitter of the third bipolar transistor, and a second terminal;

a fourth bipolar transistor having a collector coupled to the first power supply voltage terminal, a base for receiving the fourth data signal, and an emitter;

a second diode having a first terminal coupled to the emitter of the fourth bipolar transistor, and a second terminal;

a first transfer gate having a first terminal coupled to the second terminal of the first diode, and a second terminal coupled to the base of the second bipolar transistor; and a second transfer gate having a first terminal coupled to the second terminal of the second diode, and a second terminal coupled to the base of the first bipolar transistor.

3. The memory of claim 1, wherein the clock signal is further characterized as being first and second complementary clock signals.

4. The memory of claim 3, wherein the transfer gate means comprises:

a first N-channel transistor having a first current electrode for receiving the first data signal, a gate for receiving the first complementary clock signal, and a second current electrode coupled to the base of the first bipolar transistor;

a first P-channel transistor having a first current electrode for receiving the first data signal, a gate for receiving the second complementary clock signal, and a second current electrode coupled to the base of the first bipolar transistor;

a second N-channel transistor having a first current electrode for receiving the second data signal, a gate for receiving the first complementary clock signal, and a second current electrode coupled to the base of the second bipolar transistor; and a second P-channel transistor having a first current electrode for receiving the second data signal, a gate for receiving the second complementary clock signal, and a second current electrode coupled to the base of the second bipolar transistor.

5. The memory of claim 2, further comprising:

first current source means, for providing a current source for the differential amplifier and for the second terminals of the first and second diodes;

selection means for selectively coupling the first current source means to the differential amplifier and to the second terminals of the first and second diodes in response to receiving an output enable signal; and second current source means for providing a minimum current source for the differential amplifier and for the second terminals of the first and second diodes when the first current source means is deselected.

6. The memory of claim 5, wherein the first current source means comprises:

a first N-channel transistor having a drain coupled to an emitter of each of the first and second bipolar transistors, a gate for receiving a bias voltage, and a source coupled to a second power supply voltage terminal;

a second N-channel transistor having a drain coupled to the second terminal of the first diode, a gate for receiving the bias voltage, and a source coupled to the second power supply voltage terminal; and a third N-channel transistor having a drain coupled to the second terminal of the second diode, a gate for receiving the bias voltage, and a source coupled to the second power supply voltage terminal.

7. The memory of claim 6, wherein the second current source means comprises:

a fourth N-channel transistor having a drain coupled to the emitter of each of the first and second bipolar transistors, a gate for receiving the bias voltage, and a source coupled to the second power supply voltage terminal;

a fifth N-channel transistor having a drain coupled to the second terminal of the first diode, a gate for receiving the bias voltage, and a source coupled to the second power supply voltage terminal; and a sixth N-channel transistor having a drain coupled to the second terminal of the second diode, a gate for receiving the bias voltage, and a source coupled to the second power supply voltage terminal.

8. The memory of claim 7, wherein the selection means comprises:

a seventh N-channel transistor having a drain coupled to the emitter of each of the first and second bipolar transistors, a gate for receiving the output enable signal, and a source coupled to the drain of the fourth N-channel transistor;

an eight N-channel transistor having a drain coupled to the second terminal of the first diode, a gate for receiving the output enable signal, and a source coupled to the drain of the second N-channel transistor; and a ninth N-channel transistor having a drain coupled to the second terminal of the second diode, a gate for receiving the output enable signal, and a source coupled to the drain of the third N-channel transistor.

9. A memory having a latching BICMOS sense amplifier, comprising:

a differential amplifier, having first and second resistors, and first and second bipolar transistors, the first resistor being coupled between a first power supply voltage terminal and a collector of the first bipolar transistor, the second resistor being coupled between the first power supply voltage terminal and a collector of the second bipolar transistor, the differential amplifier for receiving first and second data signals, and in response providing third and fourth data signals;

latch means for feeding back the third and fourth data signals to a base of each of the second and first bipolar transistors, respectively, in response to a clock signal transitioning from a first logic state to a second logic state;

transfer gate means for preventing the differential amplifier from receiving the first and second data signals, in response to the clock signal transitioning from the first logic state to the second logic state; and reduced power data retention means for reducing an emitter current through the first and second bipolar transistors, and for reducing a current through the latch means while maintaining a logic state of the differential amplifier.

10. The memory of claim 9, wherein the reduced power data retention means comprises:

first current source means for providing a current source for the differential amplifier and for the latch means;

selection means for selectively coupling the first current source means to the differential amplifier and to the latch means in response to receiving an output enable signal; and second current source means for providing a reduced current source for the differential amplifier and for the latch means when the first current source means is deselected.

11. The memory of claim 9, further comprising:

a third bipolar transistor having a collector coupled to the first power supply voltage terminal, a base coupled to a terminal of the first resistor, and an emitter for providing a fifth data signal; and a fourth bipolar transistor having a collector coupled to the first power supply voltage terminal, a base coupled to a terminal of the second resistor, and an emitter for providing a sixth data signal.

12. The memory of claim 9, wherein the clock signal is further characterized as being first and second complementary clock signals.

13. The memory of claim 12, wherein the transfer gate means comprises:

a first N-channel transistor having a first current electrode for receiving the first data signal, a gate for receiving the first complementary clock signal, and a second current electrode coupled to the base of the first bipolar transistor;

a first P-channel transistor having a first current electrode for receiving the first data signal, a gate for receiving the second complementary clock signal, and a second current electrode coupled to the base of the first bipolar transistor;

a second N-channel transistor having a first current electrode for receiving the second data signal, a gate for receiving the first complementary clock signal, and a second current electrode coupled to the base of the second bipolar transistor; and a second P-channel transistor having a first current electrode for receiving the second data signal, a gate for receiving the second complementary clock signal, and a second current electrode coupled to the base of the second bipolar transistor.

14. A memory having a plurality of memory cells coupled to word lines and bit line pairs, each memory cell providing data to the bit line pair to which it is coupled, when the word line to which it is coupled is enabled, comprising:

address means, coupled to said plurality of memory cells, for receiving an external address signal and in response selecting a bit line pair;

a first sense amplifier for detecting and amplifying differential data signals from the selected bit line pair;

a read global data line pair, coupled to the first sense amplifier, for providing first and second data signals corresponding to the differential data signals;

a first resistor having a first terminal coupled to a first power supply voltage terminal, and a second terminal for providing a first output signal;

a second resistor having a first terminal coupled to the second terminal of the first resistor, and a second terminal;

a third resistor having a first terminal coupled to the first power supply voltage terminal, and a second terminal for providing a second output signal;

a fourth resistor having a first terminal coupled to the second terminal of the third resistor, and a second terminal;

a first bipolar transistor having a collector coupled to the second terminal of the second resistor, a base for receiving the first data signal, and an emitter;

a second bipolar transistor having a collector coupled to the second terminal of the fourth resistor, a base for receiving the second data signal, and an emitter coupled to the emitter of the first bipolar transistor;

a latch comprising third and fourth bipolar transistors and first and second diodes, a base of the third bipolar transistor coupled to the second terminal of the first resistor and a base of the fourth bipolar transistor coupled to the second terminal of the third resistor, a first terminal of the first diode coupled to an emitter of the third bipolar transistor and a first terminal of the second diode coupled to an emitter of the fourth bipolar transistor, a second terminal of the first diode being selectively coupled to the base of the second bipolar transistor in response to a clock signal transitioning from a first logic state to a second logic state, and a second terminal of the second diode being selectively coupled to the base of the first bipolar transistor in response to the clock signal transitioning from the first logic state to the second logic state;

transfer gate means for preventing the first and second bipolar transistors from receiving the first and second data signals in response to the clock signal transitioning from the first logic state to the second logic state; and reduced power data retention means for reducing an emitter current through the first, second, third and fourth bipolar transistors, and for reducing a current through the first and second diodes while maintaining a logic state of a differential amplifier, wherein the differential amplifier includes the first, second, third and fourth resistors, and the first and second bipolar transistors.

15. The memory of claim 14, wherein the clock signal is further characterized as being first and second complementary clock signals.

16. The memory of claim 15, wherein said transfer gate means comprises:

a first N-channel transistor having a first current electrode for receiving the first data signal, a gate for receiving the first complementary clock signal, and a second current electrode coupled to the base of the first bipolar transistor;

a first P-channel transistor having a first current electrode for receiving the first data signal, a gate for receiving the second complementary clock signal, and a second current electrode coupled to the base of the first bipolar transistor;

a second N-channel transistor having a first current electrode for receiving the second data signal, a gate for receiving the first complementary clock signal, and a second current electrode coupled to the base of the second bipolar transistor; and a second P-channel transistor having a first current electrode for receiving the second data signal, a gate for receiving the second complementary clock signal, and a second current electrode coupled to the base of the second bipolar transistor.

17. The memory of claim 15, wherein the reduced power data retention means comprises:

a first N-channel transistor having a drain coupled to the emitter of each of the first and second bipolar transistors, a gate for receiving a bias voltage, and a source coupled to a second power supply voltage terminal;

a second N-channel transistor having a drain coupled to the second terminal of the first diode, a gate for receiving the bias voltage, and a source coupled to the second power supply voltage terminal;

a third N-channel transistor having a drain coupled to the second terminal of the second diode, a gate for receiving the bias voltage, and a source coupled to the second power supply voltage terminal;

a fourth N-channel transistor having a drain coupled to the emitter of each of the first and second bipolar transistors, a gate for receiving the bias voltage, and a source coupled to the second power supply voltage terminal;

a fifth N-channel transistor having a drain coupled to the second terminal of the first diode, a gate for receiving the bias voltage, and a source coupled to the second power supply voltage terminal;

a sixth N-channel transistor having a drain coupled to the second terminal of the second diode, a gate for receiving the bias voltage, and a source coupled to the second power supply voltage terminal;

a seventh N-channel transistor having a drain coupled to the emitter of each of the first and second bipolar transistors, a gate for receiving an output enable signal, and a source coupled to the drain of the first N-channel transistor;

an eighth N-channel transistor having a drain coupled to the second terminal of the first diode, a gate for receiving the output enable signal, and a source coupled to the drain of the second N-channel transistor; and a ninth N-channel transistor having a drain coupled to the second terminal of the second diode, a gate for receiving the output enable signal, and a source coupled to the drain of the third N-channel transistor.

* * * * *

UNITED STATES PATENT AND TRADEMARK OFFICE
CERTIFICATE OF CORRECTION

PATENT NO. : 5,343,428
DATED : Aug. 30, 1994
INVENTOR(S) : Harold Pilo, John D. Porter It is certified that error appears in the above-indentified patent and that said Letters Patent is hereby corrected as shown below:

Claim 8, Column 11, Line 68;
    Change "fourth" to --first--.

Claim 8, Column 12, Line 1;
    Change "eight" to --eighth--.

Signed and Sealed this

Twenty-eight Day of February, 1995

Attest:

BRUCE LEHMAN

*Attesting Officer*      *Commissioner of Patents and Trademarks*